(12) United States Patent
Mewes et al.

(10) Patent No.: US 8,744,822 B2
(45) Date of Patent: Jun. 3, 2014

(54) PAVEMENT CONDITION ANALYSIS FROM MODELING IMPACT OF TRAFFIC CHARACTERISTICS, WEATHER DATA AND ROAD CONDITIONS ON SEGMENTS OF A TRANSPORTATION NETWORK INFRASTRUCTURE

(71) Applicant: Iteris, Inc., Santa Ana, CA (US)

(72) Inventors: John J. Mewes, Mayville, ND (US); Leon F. Osborne, Grand Forks, ND (US)

(73) Assignee: Iteris, Inc., Santa Ana, CA (US)

( * ) Notice: Subject to any disclaimer, the term of this patent is extended or adjusted under 35 U.S.C. 154(b) by 0 days.

(21) Appl. No.: 14/148,913

(22) Filed: Jan. 7, 2014

(65) Prior Publication Data
US 2014/0122045 A1     May 1, 2014

Related U.S. Application Data

(60) Provisional application No. 61/863,446, filed on Aug. 8, 2013.

(51) Int. Cl.
    *G06G 7/48*     (2006.01)

(52) U.S. Cl.
    USPC .............................................................. 703/6

(58) Field of Classification Search
    USPC .............................................................. 703/6
    See application file for complete search history.

(56) References Cited

U.S. PATENT DOCUMENTS 5,798,949 A * 8/1998 Kaub ................................ 703/6
2007/0208498 A1 * 9/2007 Barker et al. ................. 701/117

* cited by examiner

*Primary Examiner* — Saif Alhija
(74) *Attorney, Agent, or Firm* — Lazaris IP

(57) ABSTRACT

A pavement condition analysis system and method models a state of a roadway by processing at least traffic and weather data to simulate the impact of traffic and weather conditions on a particular section of a transportation infrastructure. Traffic data is ingested from a plurality of different external sources to incorporate various approaches estimating traffic characteristics such as speed, flow, and incidents, into a road condition model to analyze traffic conditions on the roadway in order to improve road condition assessments and/or prediction. A road condition model applies these traffic characteristics, weather data, and other input data relevant to road conditions, accounting for heat and moisture exchanges between the road, the atmosphere, and pavement substrate(s) in a pavement's composition, as further influenced by traffic and road maintenance activities, to generate accurate and reliable simulations and predictions of pavement condition states for motorists, communication to vehicles, use by industry and public entities, and other end uses such as media distribution.

30 Claims, 3 Drawing Sheets

PAVEMENT CONDITION ANALYSIS FROM MODELING IMPACT OF TRAFFIC CHARACTERISTICS, WEATHER DATA AND ROAD CONDITIONS ON SEGMENTS OF A TRANSPORTATION NETWORK INFRASTRUCTURE

CROSS-REFERENCE TO RELATED PATENT APPLICATIONS

This patent application claims priority to U.S. provisional application 61/863,446, filed on Aug. 8, 2013, the contents of which are incorporated in their entirety herein.

FIELD OF THE INVENTION

The present invention relates to pavement condition analysis. Specifically, the present invention relates to simulating and predicting pavement condition states in response to traffic characteristic data, weather data, and known road conditions.

BACKGROUND OF THE INVENTION

Predictions of pavement condition states on segments of a transportation infrastructure of roadways such as a highways and bridges with satisfactory lead times is a notoriously difficult undertaking. For example, frost development in a transportation infrastructure setting is very hard to forecast due to large error magnitudes within the field of meteorology, whereas frost forecasting requires very accurate data regarding dew point and pavement temperature, which are further dependent upon the material composition of the underlying pavement and substrates of a road, bridge, or other segment feature.

Use of meteorological data to generate pavement and/or bridge deck condition predictions is also problematic, as there are many influencing factors that are highly variable. Some of these factors are the albedo, heat capacity, conductance, texture, and emissivity of the pavement and its substrates, the solar and long wave radiation received at the top surface of the pavement, shading effects by surrounding trees and terrain, the atmospheric temperature, humidity, wind speed, and the various forms of precipitation, as well as the profound effects of winter maintenance and treatment activities, and additionally, characteristics of traffic flow, patterns, and usage. There is no currently-available system or method that considers all of these factors and accounts for their variances to produce a comprehensive model of pavement condition behavior.

Further, there is no existing system or method that incorporates all of traffic, weather, and known road conditions, either real-time or forecasted, to augment the simulation of a pavement's behavior so as to generate a more realistic representation of what current conditions look like and what future conditions will be. There is likewise no existing system or method for generating sophisticated output content for use by motorists, for communication to vehicles for automatic setting adjustments, for private and public entities, or for media consumption in response to such a pavement and road condition model, such as for example visualized representations in the form of cross-sectional time-series animations of pavement conditions.

BRIEF SUMMARY OF THE INVENTION

It is therefore one objective of the present invention to provide a system and method of generating predictions of pavement condition states from a simulated pavement behavior, in which at least traffic and weather information is integrated to produce a more realistic representation of current and future pavement conditions. It is another objective of the present invention to improve the analysis of pavement condition states generated as a result of simulating and predicting pavement condition states from pavement behavior by using sophisticated approaches to estimating the effects, and road condition implications, of traffic speed and flow, and weather data from a variety of sensors and other resources. It is still another objective of the present invention to interpret these simulations and predictions of pavement condition states into further output data for use by motorists, vehicles, companies, state and federal agencies, and media outlets.

The present invention discloses a system and method of modeling a state of a roadway in a framework for pavement condition analysis that incorporates at least traffic and weather data to simulate the impact of traffic characteristics and weather conditions on a particular section, or segment, of a transportation infrastructure over specific periods of time. Traffic data, weather data, and data regarding road characteristics are ingested from multiple sources, including for example data provided by third parties and/or collected from sensors, and may be pre-processed so that traffic and meteorological profiles are developed to reflect estimated and/or forecasted traffic speed information and localized weather data. All of this input data is used to model mass and energy balances in heat and moisture exchanges between the road, the atmosphere, and a substrate(s) in a pavement's composition, and generate accurate and reliable simulations and predictions of pavement condition states for motorists, communication to vehicles, use by industry and public entities, and other end uses such as media distribution.

In one exemplary embodiment, the present invention discloses a method of integrating traffic, weather and road condition data for modeling pavement conditions in a transportation infrastructure network, comprising one or more of the elements of ingesting, as a first set of input data, weather data collected from one or more of weather sensors, satellite networks, vehicle-based systems, and numerical weather prediction models, and developing a meteorological profile representing weather conditions on a roadway segment of a transportation infrastructure for which pavement conditions are to be modeled; ingesting, as a second set of input data, traffic data, and developing a traffic profile representing traffic conditions on the roadway segment for which pavement conditions are to be modeled; ingesting, as a third set of input data, road condition data collected from one or more of road sensors, mobile sensors, and vehicle-based systems, and developing standardized road condition reports representing roadway conditions on the roadway segment for which pavement conditions are to be modeled; assimilating, in a computing environment comprised of hardware and software components that include at least one processor configured to analyze the meteorological profiles, the traffic profiles, and the standardized road condition reports in a road condition model that simulates and iteratively adjusts pavement condition states from behavior of a pavement response to one or more of 1) changes in states of moisture resulting from heat and moisture exchanges between a pavement surface, the atmosphere, and one or more pavement substrates in a pavement's composition 2) traffic flow characteristics that include deviations from a normal traffic state at a specified period of time indicated in the traffic profile, and 3) experienced roadway conditions from the standardized road condition reports, and predicts pavement condition states over the specified period of time; and generating one or more of a plurality of output pavement conditions from the simulated and predicted pavement condition states to output data modules configured to develop spatial, trip, and time-series content in one or more related application programming interfaces, and interpretations of the simulated and predicted pavement condition states for distribution to output data modules configured to develop enhanced commercial content in one or more related application programming interfaces.

Another exemplary embodiment of the present invention discloses a system comprising one or more of the components of a computer processor and at least one computer-readable storage medium operably coupled to the computer processor and having program instructions stored therein, the computer processor being operable to execute the program instructions to operate a road condition model in a plurality of data processing modules, the plurality of data processing modules including: a data ingest module configured to receive, as input data, weather data representing meteorological conditions experienced on segments of roadway a transportation infrastructure, and traffic data representing traffic conditions experienced on segments of roadway in a transportation infrastructure, and road condition data representing factors relating to experienced road conditions on segments of a transportation infrastructure; a pavement analysis module configured to simulate and iteratively adjust pavement condition states from behavior of a pavement in response to one or more of 1) changes in states of moisture resulting from heat and moisture exchanges between the road surface, the atmosphere, and one or more pavement substrates in a pavement's composition, 2) traffic flow characteristics that include deviations from a normal traffic state at a specified period of time, and 3) experienced road conditions, and a forecast module configured to generate predictions of pavement condition states over the specified period of time.

In yet another exemplary embodiment, the present invention discloses a method of modeling pavement conditions in a transportation infrastructure network, comprising one or more of the elements of developing associations of input data to road segment metadata in a plurality of profiles in at least one processor in a computing environment comprised of hardware and software components to enable a plurality of data processing functions in a road condition model, the plurality of profiles include a meteorological profile representing weather conditions, a traffic profile representing traffic conditions, and standardized road condition reports representing experienced road conditions, for roadway segments of a transportation infrastructure; simulating and iteratively adjusting pavement condition states from a behavior of a pavement for a roadway segment in response to one or more of 1) changes in states of moisture resulting from heat and moisture exchanges between the road surface, the atmosphere, and one or more pavement substrates in the pavement's composition as a result of impacts on the pavement by weather, traffic, and road conditions experienced on the roadway segment, 2) traffic flow characteristics that include deviations from a normal traffic state, at a specified period of time, and 3) the experienced road conditions from the standardized road condition reports; and predicting pavement condition states over the specified period of time, wherein predictions of pavement condition states at least comprise forecasts of pavement surface temperatures and conditions.

Other objects, embodiments, features and advantages of the present invention will become apparent from the following description of the embodiments, taken together with the accompanying drawings, which illustrate, by way of example, the principles of the invention.

BRIEF DESCRIPTION OF THE SEVERAL VIEWS OF THE DRAWINGS

The accompanying drawings, which are incorporated in and constitute a part of this specification, illustrate several embodiments of the invention and together with the description, serve to explain the principles of the invention.

DETAILED DESCRIPTION OF THE INVENTION

In the following description of the present invention reference is made to the exemplary embodiments illustrating the principles of the present invention and how it is practiced. Other embodiments will be utilized to practice the present invention and structural and functional changes will be made thereto without departing from the scope of the present invention.

The present invention is a system and method of simulating and predicting pavement conditions states from behavior of a pavement, in a framework for pavement condition analysis. The present invention incorporates various paradigms for estimating traffic characteristics such as speed, flow, and incidents, together with other inputs such as weather and data concerning road condition characteristics relative to roadway performance, into a road condition model to analyze pavement conditions by simulating pavement condition states from behavior of a pavement in response to traffic, weather, and road conditions on a particular section or segment of a transportation infrastructure, and provide predictions of pavement condition states over specific periods of time.

The systems and methods described herein may also ingest input data that is generated from traffic estimation and/or prediction models and may also incorporate real-time and historical traffic information either directly or indirectly, such as for example from various sensors. The present invention may further incorporate additional input data for ingest into the road condition model for simulating the impact of traffic characteristics, such as for example weather sensor information, data from radar and video components, real-time traffic and weather observations provided from a number of different sources such as crowd-sourced information provided via social media feeds, historical weather data, and information from any other source which can be utilized by the road condition model to formulate analyses and predictions of pavement conditions as described further herein.

Figure 1:
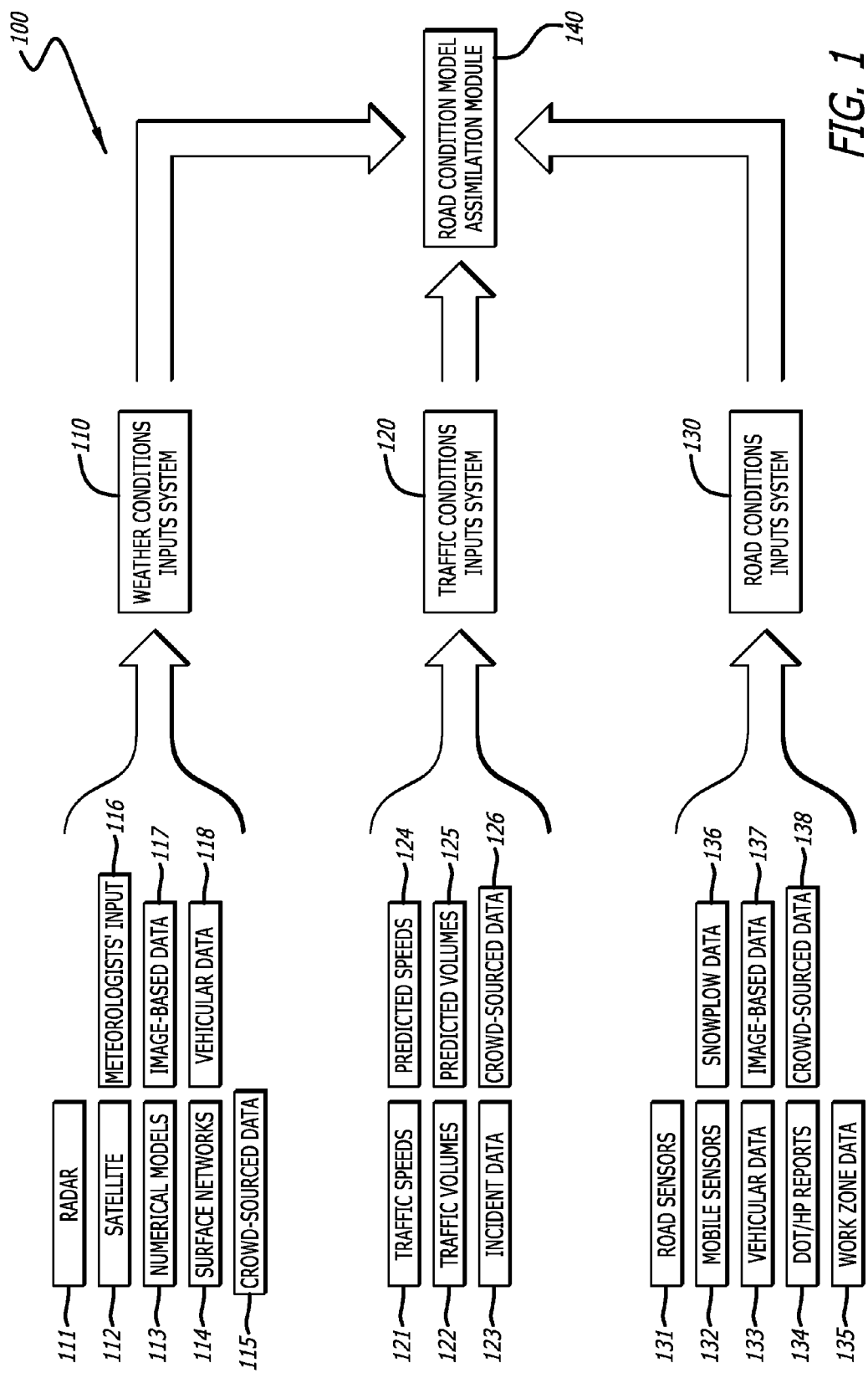
FIG. 1 is a block diagram of types of input data ingested for assimilation of weather, traffic, and road condition information in a framework of pavement condition simulation and prediction according to the systems and methods of the present invention.

FIG. 1 is a block diagram of types of input data ingested for assimilation of weather, traffic, and road condition characteristics in a pavement condition analysis framework 100 according to the systems and methods of the present invention. The various types of input data described herein are ingested into weather conditions input system 110, a traffic conditions input system 120, and a road conditions input system 130. In the pavement condition analysis framework 100, input data from these systems are provided to a road condition model assimilation module 140 for further processing in a road condition model 190.

The road condition model 190 of the pavement condition analysis framework 100 predicts pavement condition states by analyzing and modeling both mass and energy fluxes and balances in simulated pavement behavior in response to the various types of input data, using an equation of unsteady heat flow, combined with sophisticated parameterizations for representing heat and moisture exchanges between the road, the atmosphere, and the pavement composition, such as one or more substrates. Balance between mass and energy, particularly in a pavement condition context, means that changes in the state of moisture occur only as energy flows permit, so that for example, evaporating moisture away from the road surface requires energy from the road surface, which cools it. Dew or frost formation have the opposite effect of putting energy into the pavement. Perhaps more important, however, are changes between liquid and solid states of moisture. For example, in order for a road that has ice on it to warm above freezing, or vice-versa, the latent heat of fusion must be overcome. This normally causes the road temperature to stabilize at the freeze point temperature while this phase transition occurs. This also means that when moisture (as snow, rain, frost, dew) is deposited onto the road it also transfers energy to or from the road, and that evaporation or sublimation of moisture from the road requires the road to have an adequate amount of energy available to support those processes.

Such energy transfers have a profound effect on roadway conditions and on travel thereupon. The present invention applies a plurality of input data from different sources as discussed herein to improve upon the modeling of these mass and energy balance distinctions to generate more reliable and accurate analyses, simulations, and predictions of pavement conditions, and consequently, to generate information for travelers using affected roadways as well as third parties, such as maintenance providers, state or federal agencies tasked with transportation infrastructure management, traveler information providers, and media outlets.

One methodology for capitalizing on distinctions between mass and energy balance in the present invention is by using the fact that the freeze point of water can be reduced by adding certain chemicals to a treatment mixture to be applied to a pavement, such as for example salt. The road condition model 190 partitions the moisture atop the pavement surface into sections representing different possible forms that moisture can take (e.g., liquid, snow, ice, frost, compacted snow, etc.), and then uses the eutectic properties of any chemicals that are added to the mix to repartition the moisture between these sections. In this repartitioning process, mass and energy balance are maintained, since when salt is applied to a pavement with frozen moisture on it, the composition and pavement surface temperature will typically undergo a rapid drop, followed by a slower recovery. This occurs because the energy required to melt the ice is coming from the pavement, and all the salt has done is change the temperature where equilibrium exists (i.e., where there is no tendency for energy to flow from the pavement to the ice, or vice-versa).

As time passes, energy will normally be drawn upward from lower in the roadbed either in or beneath the pavement substrate, permitting the road to warm back up to near its original temperature again. This permits the road condition model 190 to simulate the simultaneous impacts of multiple deicers, each with differing properties. The mixing of chemicals requires an iterative approach to finding where the equilibrium state lies.

The importance of this ability to appropriately manage the partitioning of moisture into its different forms is that it directly influences how traffic will impact the pavement's condition. With sufficient liquid moisture present, traffic acts to splatter or spray the entire mixture off of the pavement surface. As the amount of liquid in the mixture decreases, transitions in this behavior occur, first to a consistency where the moisture atop the pavement is simply moved short lateral distances with the passage of each successive vehicle, and eventually to a consistency where the mixture is increasingly taken under the tires of each successive vehicle where it can be compacted into a more hardened form that is both difficult to travel upon and difficult to remove. Winter maintenance activities often seek to maintain sufficient liquid in this mixture so as to prevent this deterioration.

The weather conditions input system 110 facilitates ingest of many different types of weather-related data into the road condition model assimilation module 140 of the pavement condition analysis framework 100. This includes data related to meteorological characteristics such as atmospheric temperature, humidity, wind speed, various forms of precipitation, downwelling radiation, and other such information, and may be derived from, for example, radar data 110 collected from radar sensing systems, and satellite data 112 from satellite-based weather observation and tracking systems. The weather conditions input system 110 also ingests data from numerical weather prediction models 113 and surface networks 114 such as described further herein. Weather data may also be derived from data generated from crowd-sourced observations 115 using mobile applications configured on devices such as telephones and tablets, and using social media feeds. Weather data may also be generated from meteorologist input 116.

Other types of data ingested into the weather condition input system 110 include image-based data 117 from systems such as video cameras, and vehicular data 118 generated from one or more vehicle-based sensing systems, including those systems coupled to vehicle computing systems, or those systems configured to gather weather data from mobile devices present within vehicles, such as the mobile telephony devices and tablet computers noted above. Together with the traffic-related and road condition information as discussed further herein, the different sources of weather or environmental data contemplated by the present invention further enhance reliability and accuracy of the simulations of pavement behavior performed by the road condition model 190, as well as subsequent forecasts of states of pavement conditions.

The different sources of weather data ingested into the weather conditions input system 110 may include data from both in-situ and remotely-sensed observation platforms. For example, the numerical weather models (NWP) 113 and/or surface networks 114 may be combined with data from weather radars and satellites to reconstruct the current weather conditions on any particular link or segment of roadway. There are numerous industry NWP models available, and any such models may be used to input weather variables in the present invention. NWP models used herein at least include RUC (Rapid Update Cycle), WRF (Weather Research and Forecasting Model), GFS (Global Forecast System), and GEM (Global Environmental Model). This weather data is received in real-time, and may come from several different NWP sources, such as from Meteorological Services of Canada's (MSC) Canadian Meteorological Centre (CMC), as well as the National Oceanic and Atmospheric Administration's (NOAA) Environmental Modeling Center (EMC), and many others. Additionally, internally or privately-generated "mesoscale" NWP models developed from data collected from real-time feeds to global observation resources may also be utilized. Such mesoscale numerical weather prediction models may be specialized in forecasting weather with more local detail than the models operated at government centers, and therefore contain smaller-scale data collections than other NWP models used. These mesoscale models are very useful in characterizing how weather conditions may vary over small distances and over small increments of time. The present invention may be configured to ingest data from all types of NWP models into the weather conditions input system 110, regardless of whether publicly, privately, or internally provided or developed.

The traffic conditions input system 120 facilitates ingest of many different types of traffic-related data into the road condition model assimilation module 140 of the pavement condition analysis framework 100. This includes traffic speed data 121, traffic volume data 122, and roadway incident data 123 reflective of real-time and/or actual conditions being experienced on a roadway. Such traffic-related data may be ingested, for example, as an output of a traffic state estimation model from a traffic estimation platform that generates analyzed traffic characteristics such as speed and volume information from one or more sensors or third party sources. The traffic conditions input system 120 may also ingest predicted traffic speed data 124 and predicted traffic volume data 125 from a traffic prediction platform. Crowd-sourced observational data 126 may also be provided from individuals using mobile telephony devices or tablet computers using software tools such as mobile applications. This analyzed and predicted traffic-related data may be realized from many different sources as noted further herein. Depending on the source, data may be provided in either a raw form or a processed form. Processed data may be subject to a variety of paradigms that take data generated by sensors or partners and extract relevant traffic information from a traffic estimation platform, for analyzed traffic characteristics, and from a traffic prediction platform for predicted traffic characteristics as noted above, for subsequent use in the road condition model 190 of the present invention.

One such source is from external partners that collect probe data generated by global positioning system (GPS) devices. As noted above, this GPS probe data may be either in a raw form or in a processed form. Raw probe data is a collection of bulk data points in a GPS dataset, while probe data that has been processed has already been associated with information such as traffic speed on a roadway network. Prior to ingest as input data into the road condition model 190, this GPS probe data may be initially processed to develop speed estimates across traffic networks representing large geographic areas. Each such network is comprised of inter-connected links, but it is often the case that obtaining complete link speed estimates is hindered by the sparseness of the input data—i.e., GPS data is typically available for only part of the links representing a larger transportation network, and only for part of the time. In other words, collected GPS data is incomplete, making it hard for these existing systems to accurately estimate traffic speed across inter-connected network segments. Additionally, the quality and comprehensiveness of GPS probe data varies by vendor. One or more processing techniques may be used in a traffic state estimation model to iteratively smooth out this data prior to ingest into the road condition model 190, so that any missing values are temporally and spatially filled in to ensure accuracy in the traffic information derived therefrom.

These processing techniques iteratively smooth out this data by identifying missing speed values in the dataset. This is done by applying a procedure to map known GPS data to road links, in a process known as snapping. It then determines neighboring links in the same link network using network distance and road distance limits on the link values. This is followed by steps in which the present invention uses initial data in the GPS data set to build a rescaled speed profile as well as a free-flowing speed estimate. The speed profile could be compressed via a clustering analysis to reduce storage requirements. The result is a model that can be applied in real-time to fill in the missing values in an input data set by applying the snapping procedure to the GPS data, and then applying a temporal and spatial smoothing procedure to the known speed data using the rescaled speed data to arrive at sufficient estimates for the missing values. In cases where there is even less data, the profile based method is used to infer missing values. Once this is accomplished, an accurate traffic speed can be estimated from the incomplete GPS speed data. In other words, the present invention utilizes observed information for one link to estimate neighboring links that are missing observed information, and applies this process to provide a traffic speed estimate for all links at all times.

Another external source of traffic information may be provided by Bluetooth field units configured to read signals emitted by other Bluetooth devices. These field units, or readers, are passive devices which may be positioned at or near sections of a roadway to be modeled to collect vehicular information in the vicinity of that segment. These readers are configured to communicate with devices equipped with Bluetooth capabilities used by motorists in vehicles, such as mobile telephones and computers. Such devices are often used in situations where hands-free communications are either advantageous or mandatory, for example while driving. Because Bluetooth devices use a radio communications system, readers and transmitters do not have to be in visual line of sight of each other—instead, only a quasi-optical wireless path must be present to enable a Bluetooth reader, positioned at or near the side of a roadway, to detect a signal emitted by a Bluetooth device in a vehicle.

As with the GPS probe data, one or more processing techniques may be applied prior to ingest into the road condition model 190 to determine traffic information such as vehicular speed, position, proximity and incidents from data collected by Bluetooth readers. In one embodiment, a Received Signal Strength Indicator (RSSI) from one or more signals emitted by the Bluetooth devices may be observed to analyze vehicular information from a signal strength emitted from motorists passing one or more of such readers. RSSI measurements provide the ability to determine a relative distance of each Bluetooth-enabled mobile device from the reader by analyzing the strength of a signal observed, or detected, by each reader. These measurements are applied to the one or more data processing modules which may employ a mathematical approach using Fourier Transforms to determine peak signal strength from RSSI data and pinpoint vehicular sample location closest to a Bluetooth reader. Once determined, this sample location is then used for several purposes. First, this sample location can be used to derive a vehicle's position information, which may then be used to generate more accurate travel times. Second, this positional information can be combined with approach read data to create an approach vector, which may then be used to determine approximate vehicle speed. Finally, multiple approach vectors can be combined to detect roadway incidents. Bluetooth field units are therefore used to perform spot analytics by mathematically modeling the signal strength to extract data relevant to traffic information in and around a roadway link to be analyzed for pavement condition modeling in the present invention, such as vehicular position, vehicular speed, proximity of vehicles to each other, and traffic incidents.

In another embodiment, Bluetooth field units may be configured to determine traffic information from additional information emitted by passing Bluetooth devices. The present invention uses these field units to detect MAC addresses from Bluetooth transmitting devices in the vicinity of the unit. These MAC addresses are logged together with the time of detection, so that counts of all passing vehicles enable the number of vehicles passing the readers during any period to be calculated. A comparison of logs from multiple readers allows the travel time between points to be calculated. The vehicle counts also enable estimates of the total delay between two data collection points (the readers). Data from a plurality of readers may further enable the calculation of one or more paths of vehicles from vectors representing origin and destination points, for an analysis of how real-time traffic is maneuvering in and around roadway links for which pavement is to be modeled.

The road conditions input system 130 facilitates ingest of data concerning many different types of road condition characteristics into the road condition model assimilation module 140 of the pavement condition analysis and prediction framework 100. Such data relates generally to other characteristics of roadway performance, such as for example maintenance activities and effects of maintenance treatments applied to surfaces in adverse conditions. This includes road sensor data 131, which incorporates information from sensors placed in or near roadway surfaces to detect and monitor pavement conditions. It also includes data collected by mobile sensors 132 and vehicular data 133. Other types of data ingested into the road conditions input system 130 include reports 134 from states or other entities responsible for roadway performance or maintenance, work zone data 135, snowplow data 136, and image-based data 137 such as that collected by systems such as video cameras. Reports 134 may be generated by, for example, state departments of transportation, from state highway patrol departments, and any other such organization responsible for transportation networks. Crowd-sourced observational data 138 may also be provided from individuals using mobile telephony devices or tablet computers using software tools such as mobile applications, and from other sources such as social media feeds.

In one embodiment of the present invention, this type of road condition data is generated by one or more maintenance decision support systems which ingest such data into the road conditions input system 130. Maintenance decision support systems generally are systems operated or maintained by agencies and entities responsible for winter transportation infrastructure maintenance collect data from weather maintenance vehicles, often using mobile/maintenance data collection and automated vehicle location systems (known in the industry together as MDC/AVL systems). Such systems utilize global positioning systems (GPS) and on-board data logging and/or transmission capabilities to provide instantaneous GPS-tagged reports of winter maintenance vehicle activities (e.g., plow position(s), material applications, etc.) and/or observed environmental conditions (e.g., road temperatures and/or conditions, etc.). Road condition information from these types of systems further enhances reliability and accuracy of the simulations performed by the road condition model 190, as well as subsequent predictions of pavement condition states, by incorporating data regarding the impact of weather and maintenance activities on the pavement and its various material compositions.

Road condition data may be provided by maintenance decision support systems that are configured to generate information on the impact of weather and maintenance activities using a variety of formats, and from different configurations of such systems themselves. Accordingly, it is contemplated that where data is ingested into the road conditions input system 130 and the road condition model assimilation module 140, it is not to be limited to any one or specific format or configuration. For example, in one embodiment, road condition data may be ingested from systems configured to quantify maintenance activities that being performed, and the results of those activities, and also configured for independently simulating maintenance activities which were required, and the expected results of those activities, in response to observed weather conditions. In other words, the present invention contemplates that road condition data may be ingested into the road condition model 190 in a pre-processed form that both enables winter maintenance managers to better understand their current winter maintenance operations, and provides independent, weather-sensitive metrics against which the effectiveness and efficiency of winter maintenance operations can be evaluated, prior to additional simulations performed using weather and traffic information.

It is to be further contemplated that where such maintenance decision support systems are utilized to provide road condition data, the present invention is not to be limited to any software or hardware configuration of such a system. For example, processing of data performed by a maintenance decision support system may be either centralized or localized. In one embodiment, therefore, road condition data may be provided by maintenance decision support systems in which users retrieve and manipulate information needed to perform the various actions attendant to roadway maintenance decision-making at a localized level. Such localized systems may be software-based applications that utilize a plurality of modules within a hardware and software computing environment configured to perform customized modeling of road conditions in response to the data ingested, such as weather, observed road conditions, and data from sensors and instruments, and to generate treatment recommendations for winter maintenance activities. Modeling of road condition data in such a framework is performed at or near the area of the roadway where maintenance treatments may be applied.

Figure 2:
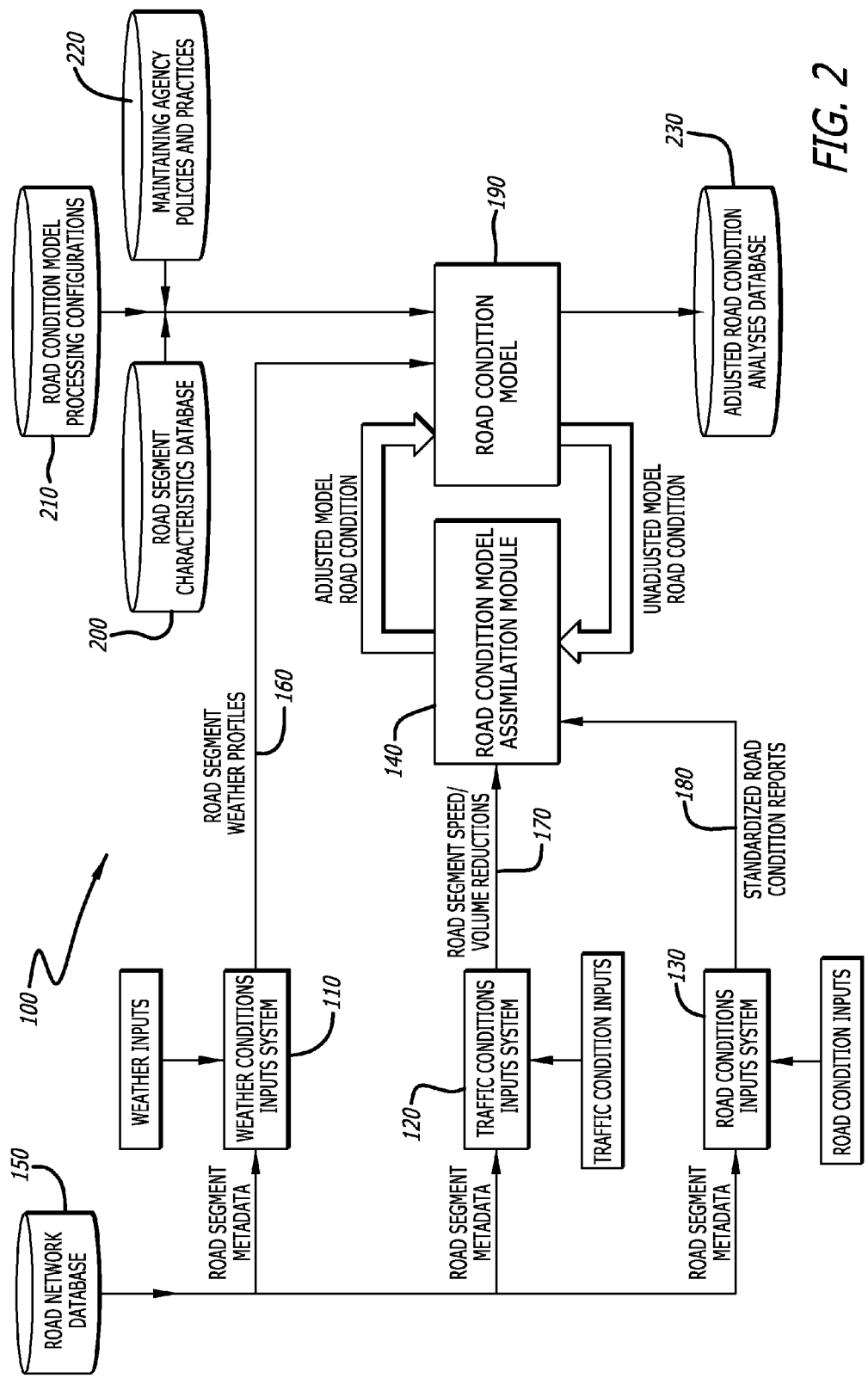
FIG. 2 is a block diagram of a data assimilation process in a framework of pavement condition simulation and prediction according to the systems and methods of the present invention.

FIG. 2 is a block diagram of a process of data assimilation in the pavement condition analysis framework 100. The weather conditions input system 110, traffic conditions input system 120, and road conditions input system 130 are each communicatively coupled to a road network database 150, so that metadata and other information relative to segments, or links, or a roadway network are correlated for the various weather, traffic, and road condition inputs to which they apply.

Using the information from the road network database 150, the weather conditions input system 110 aggregates the incoming weather input data and generates meteorological profiles 160 for road segments being modeled. The traffic conditions input system 120, using information from the road network database 150, aggregates the incoming traffic data and generates road segment traffic profiles 170 comprising speed and volume, or reductions, for a particular road segment. Additionally, the road conditions input system 130, also using the information from the road network database 150, aggregates the incoming road condition input data and generates standardized road condition reports 180. The road segment meteorological profiles 160, road segment traffic profiles 170 comprising speed and volume reduction information for a particular road segment, and the standardized road condition reports 180 associate the weather data, traffic data, and road condition data with segments of the roadway network to which they relate, and are communicated to the road condition model assimilation module 140 for further assimilation of input data for the road condition model 190 and simulation of responses to the conditions identified in the various types of input data.

The ingested data described above, and the association of ingested data to develop road segment meteorological profiles 160, road segment traffic profiles 170, and standardized road condition reports 180 from such data, occurs within a computing environment forming at least a part of the pavement condition analysis framework 100. The computing environment includes software and hardware components configured to execute program instructions in one or more data processing modules to perform the simulations of pavement conditions, and subsequent pavement condition predictions, as described further herein. Also included is a data ingest module configured to receive the input data from many different sources, also as further described herein.

The road condition model 190 adjusts the simulation process with numerical, time-step integration of input data 110 so that pavement condition states based on the behavior of a pavement are iteratively generated. Accordingly, the pavement condition analysis framework 100 models input data 110 in an ongoing process in which adjustments are iteratively made during the simulation process. These iterative adjustments are performed in response to one or more of changes in states of moisture resulting from heat and moisture exchanges between a pavement surface, the atmosphere, and one or more pavement substrates in a pavement's composition indicated in a meteorological profile, traffic flow characteristics that include deviations from a normal traffic state at a specified period of time indicated in a traffic profile, and experienced roadway conditions indicated in standardized road condition reports.

At least it pertains to such experienced roadway conditions, the iterative aspect of the simulation and adjustment may be performed for a specified period of time, such as to account for deviations between a simulation outcome and an experience roadway condition. For example, the road condition model 190 may produce a simulated pavement state that is just above freezing for a given time. However, if a road condition report is received that indicates an icy roadway condition at that time, the road condition model 190 can switch the form of the moisture on the pavement to ice. When this occurs, the road condition model 190, still having pavement temperatures above 32° F., starts melting some or all of this ice in subsequent numerical integration time-steps. The 'icy' road condition report is therefore re-applied again and again in iterative adjustments, after each numerical integration time-step, for a specified period of time (typically on the order of 15-30 minutes, which might be on the order of 10-20 numerical integration time-steps). The reintroduction of the ice to the pavement surface after each time-step continually takes heat away from the pavement in each time-step, until after some number of time-steps the pavement in the road condition model 190 is cold enough to maintain that icy condition. At that point the road condition model 190 stops iteratively re-applying the icy observation from a road condition report. Therefore, such experienced road conditions are imposed on the road condition model 190 for only a long enough period of time to permit the related aspects of the pavement temperature to come into equilibrium with the experienced road condition.

In addition to the sources of input information discussed above, the road condition model 190 is also communicatively coupled with one or more additional database units to obtain additional data to facilitate this simulation and iterative adjustment of pavement condition states from roadways' responses, and subsequent prediction of pavement conditions within the pavement condition analysis framework 100. The additional database units include a road segment characteristics database 200, a database of road condition model processing configurations 210, and a database of management agency policies and practices 220.

Road segment characteristics database 200 is accessed by the road condition model 190 to obtain additional link information about the segments of roadway being simulated. For example, the road condition model 190 may require geospatial coordinates for accurate and reliable simulations of pavement behavior in response to the various types of input data, as well as specific features and other characteristics of the segment of roadway. Examples of such features and other characteristics include the specific material composition of the pavement and its substrate(s), the age of the segment, whether the segment is or includes bridges and the type of bridge(s) present, and the elevation and/or slope of the segment. Many other such features and characteristics may be possible, and road condition model 190 is configured to access the road segment characteristics database 200 or any other such database for this information.

The road condition model processing configurations database 210 is accessed by the road condition model 190 to obtain information and instructions for the specific processing paradigms to be performed when simulating pavement behavior in response to the various types of input data. For example, as noted below, one way in which the road condition model 190 simulates the impact of traffic on pavement conditions is by applying "virtual" vehicles at a rate consistent with reality for a given link. The road condition model processing configurations database 210 stores characteristics relevant to such a "virtual" vehicle, such as tire properties, width between tires, specific track it follows within lanes, and various parameters describing the impact of each tire on varied moisture compositions at a range of travel speeds. Other examples include information regarding the physical, thermal and radiative properties of the pavement and its substrate in order to simulate energy capacities and flows within the pavement profile; information regarding eutectic and other properties of deicers and abrasives that may be used on a roadway section or segment; and information relating properties of the ambient environment to expected roadway impacts.

The maintaining agency policies and practices database 220 is accessed by the road condition model 190 to obtain information used to modulate the simulations and resultant forecasts generated by the present invention relative to how the roadway is maintained by the agencies or entities responsible for infrastructure maintenance. For example, accurate and reliable simulations performed by the road condition model 190 may be improved by incorporating policies and practices for maintaining pavements in various weather, traffic, and roadway maintenance patterns. The road condition model 190 may therefore be able to improve simulations and predictions by modeling pavement response to certain treatment materials applied to the roadway. Since different agencies and entities have different policies and practices, simulations for different segments of a transportation infrastructure may vary based on its location, type, and characteristics, which in turn may relate to responsibility for its maintenance. Other examples include the expected hours of operation observed by the maintaining agency, and level of service specifications that describe road condition expectations during and after a weather event. The maintaining agency policies and practices database 220 stores such information, and the road condition model 190 is configured to query this database as part of the simulation and forecasting process as needed.

As noted above, one way in which the road condition model 190 simulates the impact of traffic on pavement conditions is by applying "virtual" vehicles at a rate consistent with reality for a given link, or roadway segment. Each such vehicle is assigned slightly different characteristics, such as in terms of tire properties (width, number, etc.), width between tires, and the specific track it follows within a lane on the roadway. As virtual traffic flows in the road condition model 190, the various sections of moisture described above are transformed as the moisture migrates across and/or off of a cross-section of the pavement, depending in part on the properties of that moisture. For instance, snow may be compacted under the tires if insufficient liquid is present, spread or splattered to the side if it is slushy, or suctioned off by the vacuum associated with the passing vehicle if it is light, fluffy and/or dry snow. Liquid water may be sprayed or splattered away, or run off through the effects of gravity on a sloped road, etc. The end result is a simulation of the state of the pavement's surface and other layers that provides a realistic visual representation of what the roadway is likely to look like to persons traveling the road, and hence the roadway conditions they are likely to experience. This permits generation of realistic cross-sectional animations of pavement conditions as noted further herein, which are directly visually comparable to actual conditions, thereby aiding both assimilation of visual reports of road conditions as well as conveyance of expected road conditions to users of the simulated data.

The integration of traffic information, and the resulting road segment traffic profile 170 comprised of road segment speed and volume, or reductions, developed by the traffic conditions input system 120, regardless of the source and type of data contemplated herein, has the ability to enhance the reliability and accuracy of road condition assessments and/or prediction. Transportation agencies widely recognize the impact of adverse road conditions on traffic flow, and it is often the situation that such agencies use traffic data as an indicator of their winter maintenance performance during adverse weather. This traffic information influences the vehicular characteristics that are rated consistent with reality for a given link in the "virtual" vehicles created for modeling pavement behavior and condition states, at least with respect to the movement of the various sections of moisture described above off of a cross section of the pavement, as virtual traffic flows in the road condition model 190. In addition to this, the present invention also contemplates that traffic information such as speed data may act as a surrogate for road condition observations, in particular as a way of knowing whether the road is in good driving condition or not. The present invention is therefore configured to incorporate traffic information such as speed data, and other vehicular data such as flow, proximity, and incidents, to adjust a running assessment of the road conditions on each particular link stretch of road accordingly.

As noted above, the road condition model 190 also has the ability to assimilate observations 115, 126, and 138 of road condition characteristics as input data for the data ingest module and for further enhancement of the traffic 170, meteorological 180 and road condition 190 profiles developed. Such observations 115/126/138 may serve to augment the amounts of moisture in the various sections partitioned by the road condition model 190 as described above, as well as the cross-sectional distribution of that moisture, in a manner that is consistent with the observation that is provided. Incorporation of such observations 115/126/138 has the effect of permitting the road condition model 190 to recognize that there may be various places along the segment being modeled where uncertainty exists. For instance, if an observation that a segment of the road is wet is ingested as an input, yet the road condition model 190 has already considered that this segment is covered in snow, it is quite possible that a chemical application has occurred that the present invention was not previously aware of. In this case, it may be preferable to artificially add some chemical to the pavement surface to support the wet road condition rather than adjusting the road condition to wet (which would likely simply lead to the model refreezing it right away) or adjusting the road temperature upward. In this manner, the addition of road condition observations 115/126/138 modulate the road condition model 190 by adjusting the simulations performed to ensure that real-time traffic, weather, and roadway conditions are accounted for to generate the most reliable and accurate output analysis of the pavement state.

There are many examples of different types of sources from which such observations 115/126/138 may be provided. For instance, motorists themselves may provide observations, such as in the form of textual input into, or visual images collected by, mobile devices such as telephones and tablets used inside vehicles themselves. Observations 115/126/138 may also be generated by maintenance workers or entities tasked with applying treatments or performing maintenance activities, such as in roadway work zones. Still other observations may be provided by law enforcement personnel, in the vicinity of a roadway link to be modeled. The present invention contemplates that any source of real-time or current observations may be utilized, and that many different means may be used to enter and record such observations 115/126/138.

The plurality of different types of traffic data may further include sensor systems configured to collect information from either the roadway itself, locations proximate to or near the roadway for which pavement conditions are to be modeled, or from vehicles passing through or near that particular section of the road. For example, data may be collected from sensors embedded in sections of a roadway which are within the vicinity of the section being modeled, or the section to be modeled itself, such as with traditional loop detectors or road surface condition sensors. Data may be collected from video cameras oriented so as to capture images of a roadway, and from radar units configured to detect signals emanated onto a roadway and reflected back from vehicles or road conditions that are present. Additionally, data may also be collected from vehicles themselves, such as for example from on-board GPS devices or other sensors, or from mobile devices used by motorists.

Using the example of data collected from video cameras, the road condition model 190 may be configured to adjust its simulation of pavement conditions based on image analysis of data ingested from road-oriented cameras. Such data may be able to provide visual characteristics of the pavement condition state which can be used to confirm, modulate, or revise the simulated pavement composition condition, including the cross-sectional distribution of the different forms of moisture that comprise this condition, so that image data may at least be used as a method of adjusting the pavement condition simulations and predictions based on other data, such as for example traffic, weather, and maintenance or construction information.

Figure 3:
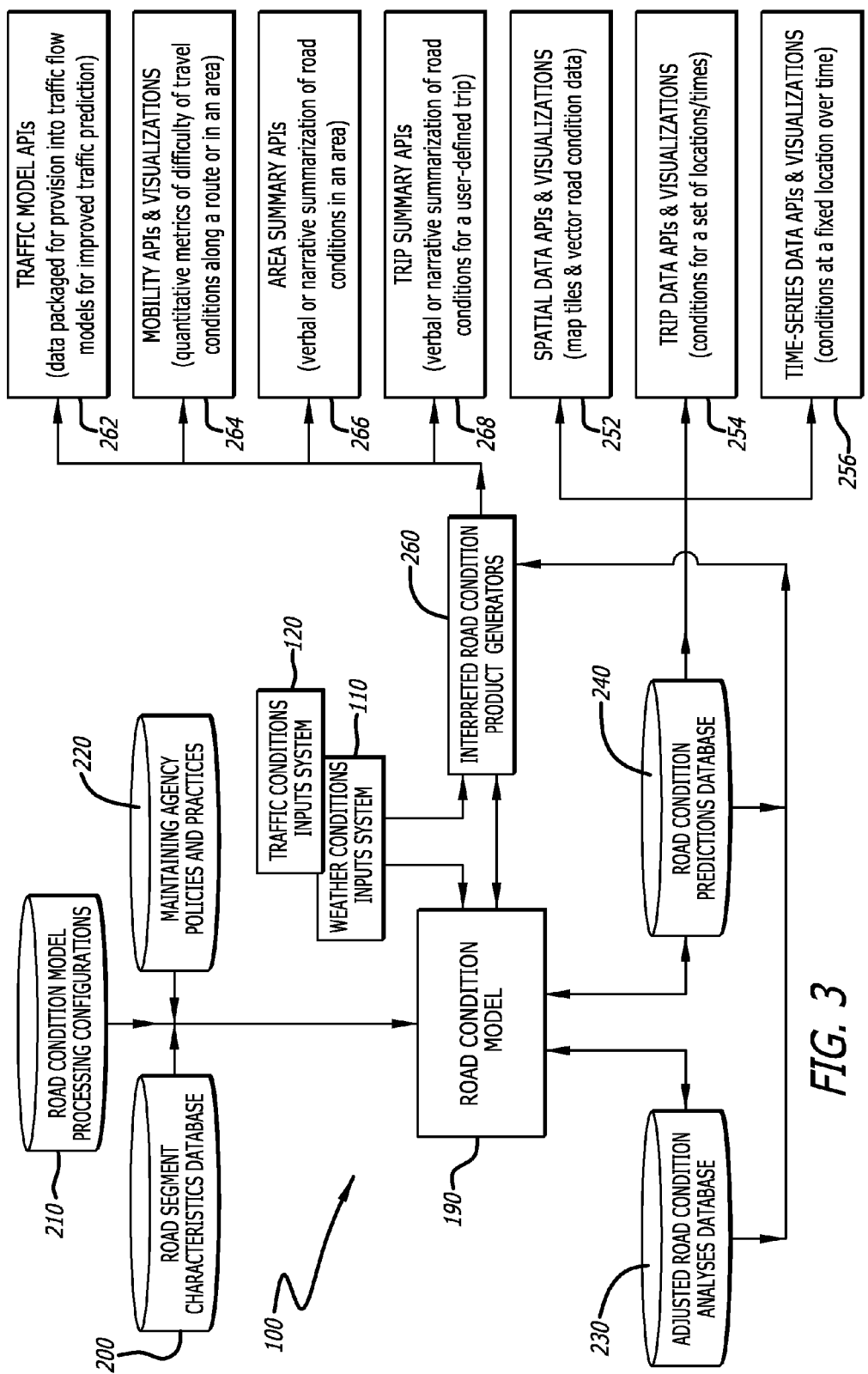
FIG. 3 is a block diagram of prediction and output dissemination in a framework of pavement condition simulation and prediction according to the systems and methods of the present invention.

FIG. 3 is a block diagram of components and processes for output dissemination in a pavement condition analysis framework 100 according to the systems and methods of the present invention. As discussed above, the road condition model 190 analyzes the various types of input data ingested into the pavement condition analysis framework 100 by performing simulations of pavement conditions at segments of the roadway. These simulations analyze distinctions between mass and energy balances using an equation of unsteady heat flow, combined with sophisticated parameterizations for representing heat and moisture exchanges between the road, the atmosphere, and pavement substrate and other components of its material composition, and produce simulations of pavement condition states for segments simulated over specified periods of time. Several different types of output data are generated as a result of the data processing performed by the road condition model 190.

The road condition model 190 performs both the simulations and predictions of pavement condition states using the input data ingested via the weather condition input system 110, the traffic conditions input system 120, and the road conditions input system 130. Simulation outputs may be generated as pavement condition analyses adjusted by the road condition model 190 using the information from the road segment characteristics database 200, the road condition model processing configurations database 210, and the maintaining agency policies and practices database 220. The road condition model 190 communicates these simulations to an adjusted analyses database 230, and applies these simulations to generate forecasts of pavement condition states, which are communicated to a road condition predictions database 240.

The road condition model 190 is therefore configured to simulate pavement condition states from behavior of a pavement in response to the various input data and modulated by the additional information as noted above, and to apply those simulations to generate predictions of pavement condition states for the road segments simulated over specified periods of times. These forecasts are then applied and/or interpreted for output to applications for a plurality of commercial uses.

As noted above, the road condition model 190 performs these tasks in one or more data processing modules that carry out the simulations of pavement condition states from behavior of a pavement, and resultant pavement condition predictions. Accordingly, the road condition model 190 may include a simulation portion configured to ingest the various types of data via data ingest module and perform the modeling described herein, and a prediction portion configured to access simulations from the adjusted analyses database 230 to construct predictions of pavement condition states for specific road segments over specified periods of time, and generate output paradigms for the plurality of commercial uses.

The adjusted analyses database 230 may be configured to maintain information related to traffic flow characteristics for specific segments of a transportation infrastructure for various period of time. These traffic flow characteristics can be used by the road condition model 190 to form "snapshots" of normal traffic states and expected deviations for specified periods of time. The road condition model 190 can apply these normal traffic states and expected deviations to modulate simulated behavior of the pavement in response to other input data and adjust output for consistency with traffic flow characteristics.

Pavement condition simulations and predictions are communicated from the road condition analyses 230 and predictions 240 databases to a plurality of modules 250 configured to generate application program interfaces (APIs) and visualizations of information derived from the analyses of pavement condition states. One such data processing module is a spatial data module 252 that generates spatial data and visualizations of such spatial data, such as for example vectors of roadway conditions data and map tiles, in one or more APIs configured to provide or support mapping functions for users. These APIs provide users with analyzed pavement condition states in a map-based display of output data, or data objects appropriate for representing spatial data, from the road condition model 190. The map-based displays show pavement condition states in a vectorized form, and the data displayed may be provided as tiles for rendering on a graphical user interface. The map-based displays may be rendered in a variety of different ways, such as using animations, in three dimensions, or any other known format.

Another of the modules 250 is a trip data API module 254 that generates trip data and visualizations of trip data in one or more trip data APIs. For example, this module 254 generates forecasts of conditions for a set of locations and times defining a trip to be taken by users of the trip data API. Similar to the spatial data APIs, the trip data APIs may be configured to provide trip data in appropriate data objects, or on a graphical user interface in a variety of different ways, such as using animations, in three dimensions, or any other known format.

Still another of the modules 250 is a time-series data API module 256 that generates time-series representations and related visualizations of pavement condition states in one or more time-series data APIs. For example, this time-series data API module 256 generates displays of conditions over periods of time for segments of a roadway defined by users in one or more APIs configured to generate such time-series representations. These APIs may be configured to generate these time-series representations in a number of ways, such as for example data objects, or graphical plots or animations on a graphical user interface.

The pavement condition analysis framework 100 may further include an interpretation module 260 configured to generate interpreted output data from the road condition model 190 for additional consumption in one or more uses or products. For example, a module configured to facilitate traffic model input APIs 262 packages data representative of pavement condition states from the road condition model 190 and provides that packaged data to traffic flow models for improvements to traffic forecasting. Another example of additional consumption of interpreted output data in one or more uses or products is a module configured to facilitate mobility APIs 264 and visualizations of related data. Mobility APIs 264 perform quantitative metrics on simulated pavement condition states to assess difficulty of travel conditions along a route or in an area.

Yet another module in FIG. 3 is an area summary API module 266. This module 266 is configured to provide verbal and/or textual narrative summarizations of road conditions along a route or in an area. Similarly, a trip summary API module 268 is configured to facilitate conversion of pavement predictions from the road condition model 190 into verbal and/or textual narrative summarizations of road conditions for a user-defined trip along a route or in an area. The summarizations generated by area summary API module 266 and trip summary API module 268 may be delivered to users via either a graphical or aural user interface on a computer, tablet, or mobile telephony device, or via text messaging, social media feeds, or any other form of delivering text-based narratives.

As noted above, the road condition model 190 analyzes behavior of pavement responses using the input data provided, and generates simulations and predictions of pavement condition states for specific segments of a roadway for specified periods of time. These simulations and predictions can be configured for a variety of downstream output uses using the plurality of modules for APIs described above, such as to communicate information to vehicles and vehicle operators, for example by generating informational displays or messages to vehicles and their operators, or users of applications in vehicles, to trigger automatic adjustments to vehicle settings, and to create a visual representation of what the road is likely to look like to motorists traveling the modeled section of the road.

There are many different embodiments in which such simulations and predictions can be used to generate further output data for consumer and other use. Examples of uses of such output data include adjusting vehicle settings, such as enabling traction control, disabling cruise control, or other settings associated with automatic vehicle operation, communicating current and/or forecast road temperature or conditions, and communicating information about the risk of frost or other adverse conditions to drivers. In one embodiment, the present invention may be configured to utilize pavement surface condition simulations and/or forecasts to provide more useful information to a driver than is presently available, such as when a vehicle is started, or when the vehicle is entering an area for which alerts would be helpful. The present invention may include a data processing module that is capable of predicting the probability of frost, by comparing the proximity of the pavement and dew point temperatures, as well as the proximity of the pavement temperature to freezing, relative to the uncertainty in each. Where the road condition model 190 is able to make an assessment pavement surface temperatures, it can use what is known about the uncertainty in those to assign a risk that frost is forming or will form, and deliver an informative message to a vehicle operator, such as for example to reduce speed or change lanes. Such a message may be coupled with a touchscreen option, for example, to turn on vehicular traction control. Information derived in this manner may be used to deliver content into a moving vehicle to assist motorists to reduce the risk of accidents, and therefore improve safety. Such information may be of considerable utility, for example, to insurers seeking ways to reduce risk to insured vehicles, whether private or part of a broader commercial or public fleet.

Other exemplary uses of output data from the analyses of the road condition model 190 include generating information for use in travel planning and in route optimization. The present invention is configured to extract analyzed and predicted weather conditions out of high-resolution grids, "snapping" out data for any particular link segment or stretch of road in order to predict how that link or stretch of road is going to respond to weather conditions. This information can then be utilized to modulate a traffic prediction model in a separate approach to traffic modeling that would aggregate multiple types of data (pavement surface conditions, traffic, and weather) into, for example, a trip planning tool that provides both estimated travel times and indications of the adversity of travel conditions for various route options and/or departure and arrival times. Such output can further be used to suggest optimal routes and/or departure times so as to minimize any disturbances, such as the impact of adverse conditions, during a trip.

Accordingly, in another embodiment of the present invention, output data generated by the analytical paradigms described herein may be integrated into a travel planning tool facilitated by one or more the APIs from the plurality of modules described above to provide a plurality of routing, traffic, and weather data. A travel planning tool according to this embodiment may be configured to provide an informational display or message(s) to the user of the tool, including one or more of an indication of road conditions expected along available paths of travel as a function of the user's desired departure or arrival time, and measures of the adversity of travel conditions along available paths of travel as a function of the user's desired departure or arrival time based on a plurality of traffic, weather, and road conditions, and suggested paths of travel based on the user's desired departure or arrival time, based on adversity derived from a plurality of traffic, weather, and road conditions.

In addition to generating output of significant value to the general public, there are additional uses of output data from the pavement condition analysis framework 100 that may include generating information of quantifiable benefit to the long haul trucking industry. Similar to the travel planning tool discussed above, the analysis of weather conditions in high-resolution grids can be applied in a module to predict how a link or stretch of road is going to respond to weather conditions, and this information can be then be utilized to help trucking dispatchers manage cargo transit times for safety and/or efficiency, and minimize fuel wasted due to poor traffic flow and/or adverse headwinds. The present invention therefore contemplates that, in another embodiment, multiple types of data may be modeled and aggregated into a dispatch planning tool that integrates roadway condition with one or more of routing, traffic, and weather data to optimize cargo arrival and departure times, minimize travel and waiting times, improve safety, and optimize fuel efficiency.

In a further embodiment, output data from the pavement condition analysis framework 100 may be integrated with additional real-time traffic data indicative of traffic abnormalities, which may serve as an indicator that maintenance is needed and as a trigger for a recommendation for winter road maintenance activities based on mobility patterns evident in the traffic data. The present invention may further be configured to generate information in the form of push notifications to public or private agencies when the pavement surface condition is predicted to have very high pavement temperatures, for example as an indicator of the potential for pavement blow outs.

The present invention also contemplates that output data may be generated for visual representation of the information contained therein, for a variety of consumptive uses, such as for distribution to media outlets, as noted above. For example, output from the pavement condition analysis framework 100 may be presented to users as an animated time-series of cross-sectional profiles of pavement conditions, as well as underlay maps of such conditions, to go along with weather forecast graphics. Other graphical indicia of road temperatures, conditions, and/or impacts on safety and/or mobility at various times may also be presented alongside other weather information (e.g., television programs have presentations that step through screens highlighting conditions at varied intervals over a course of time, such as the next day). The present invention contemplates that road temperature and/or condition information may also be incorporated into such presentations. In addition to generating content for delivery for use by media, output data from the road condition model 190 may also be displayed by graphical user interfaces via web-based or app-based modules. A voice-based output may also be generated to verbally warn motorists of poor roadway conditions, such as via applications resident on mobile telephony, tablet, or wearable devices.

Accordingly, in yet another embodiment, the present invention contemplates integrating output data from the road condition model 190 into a broadcast media presentation tool configured to provide informational displays or messages, either in visual, textual, or audial form, to a broadcast audience. Content of such informational displays or messages may include one or more of current or expected road temperatures, conditions, or other properties, map-based presentations depicting the expected response of road conditions to expected weather events and traffic influences, cross-sectional profiles depicting the expected response of pavement conditions to expected weather events and traffic influences, and indicators of the expected adversity of travel conditions based on the road condition output data.

In still another embodiment, the present invention contemplates integrating output data from the road condition model 190 into a traveler-oriented weather or traffic prediction tool or device configured to provide informational displays or messages, either in visual, textual, or audial form, to one or more users. In this embodiment, and similar to the content described immediately above, content of such informational displays or messages may include one or more of current or expected pavement temperatures or conditions, map-based presentations depicting the expected response of pavement conditions to expected weather events and traffic influences, cross-sectional profiles depicting the expected response of pavement conditions to expected weather events and traffic influences, and indicators of the expected adversity of travel conditions.

In yet another embodiment, output data from the pavement condition analysis framework 100 may be integrated into one or more tools configured to model logistical planning for commercial and/or online retailers, parcel delivery services, and commercial shipping services such as those who move products from location to location to meet retail demand. The road condition model 190 may be utilized to develop metrics that enable such services to predict difficulty in making parcel deliveries in the days and weeks leading up to major holidays, such as Christmas. For example, modeling of pavement conditions in response to pre-Christmas storms may provide an indication that customers who would have normally made in-store shopping visits would instead me more likely to order gifts using online sites. The road condition model 190 may provide metrics to enable parcel delivery services to anticipate such events, which may cause the number of packages that needed to be delivered to spike.

The pavement condition analysis framework 100 may also be configured to combine weather and pavement condition metrics as output data that may be used by retailers to anticipate shopping trends. For example, such metrics may indicate a need to shift products from warehouses to locations expected to be hit by adverse weather, such as items need in winter or right after a heavy storm. If such metrics indicate that a storm is advancing right before a holiday weekend prior to Christmas, retailers may need to ship products from warehouses to sales locations in advance of the storm to avoid delays in getting products on store shelves and meet consumer demand in that short time frame. Similarly, big-box retailers that have experienced sales losses to online retailers may be interested in ways to keep from losing further business, such as for example by running marketing campaigns or advertisements that highlight their own online stores in locations where tough winter weather, travel, or roadway conditions are expected during the holiday shopping season.

It is to be noted that such a logistical planning tool is not to be limited to package delivery services or to commercial shipping services during holiday shopping periods, and that the road condition model 190 may therefore also be utilized to improve delivery vehicle routing in a wide array of industries. Efficiency improvements for delivery services of all types, as well as cost savings and improvements in driver safety and product spoilage may be realized by the road condition model 190, such as for further example delivery of supermarket stock, shipping of products from ports to distribution warehouses to retail locations, transportation of medicines and time-sensitive supplies for hospitals such as blood, etc.

In still another embodiment, output data from the pavement condition analysis framework 100 may be configured to provide modeling for pavements of different sizes and shapes, and provide information for all types of commuting, such as walking, bicycling, public transit, taxi, and others. For example, one or more tools may be configured to incorporate such output data and generate information for commuters. Where a traveler has indicated or booked a taxi or private livery service, the present invention may generate and communicate a message indicating that the trip may take longer than expected, together with an estimate of how much longer, and why. Similarly, where a pedestrian has indicated a walking trip from place to place, the present invention may generate and communicate a message indicating that unmaintained sidewalks will be icy, and suggest use of appropriate footwear and caution, or recommend alternative travel plans. In a public transportation setting where a commuter that has indicated travel on, for example, a bus, trolley or tram, the present invention may generate and communicate a message indicating that the scheduled bus route is likely to be delayed by x number of minutes due to overnight precipitation that created icy roads.

The systems and methods of the present invention may be implemented in many different computing environments. For example, they may be implemented in conjunction with a special purpose computer, a programmed microprocessor or microcontroller and peripheral integrated circuit element(s), an ASIC or other integrated circuit, a digital signal processor, electronic or logic circuitry such as discrete element circuit, a programmable logic device or gate array such as a PLD, PLA, FPGA, PAL, and any comparable means. In general, any means of implementing the methodology illustrated herein can be used to implement the various aspects of this invention. Exemplary hardware that can be used for the present invention includes computers, handheld devices, telephones (e.g., cellular, Internet enabled, digital, analog, hybrids, and others), and other such hardware. Some of these devices include processors (e.g., a single or multiple microprocessors), memory, nonvolatile storage, input devices, and output devices. Furthermore, alternative software implementations including, but not limited to, distributed processing, parallel processing, or virtual machine processing can also be configured to perform the methods described herein.

The systems and methods of the present invention may also be partially implemented in software that can be stored on a storage medium, executed on programmed general-purpose computer with the cooperation of a controller and memory, a special purpose computer, a microprocessor, or the like. In these instances, the systems and methods of this invention can be implemented as a program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Additionally, the data processing functions disclosed herein may be performed by one or more program instructions stored in or executed by such memory, and further may be performed by one or more modules configured to carry out those program instructions. Modules are intended to refer to any known or later developed hardware, software, firmware, artificial intelligence, fuzzy logic, expert system or combination of hardware and software that is capable of performing the data processing functionality described herein.

It is to be understood that other embodiments will be utilized and structural and functional changes will be made without departing from the scope of the present invention. The foregoing descriptions of embodiments of the present invention have been presented for the purposes of illustration and description. It is not intended to be exhaustive or to limit the invention to the precise forms disclosed. Accordingly, many modifications and variations are possible in light of the above teachings. It is therefore intended that the scope of the invention be limited not by this detailed description.

The invention claimed is:

1. A method of integrating traffic, weather and road condition data for modeling pavement conditions in a transportation infrastructure network, comprising:

ingesting, as a first set of input data, weather data collected from one or more of weather sensors, satellite networks, vehicle-based systems, and numerical weather prediction models, and developing a meteorological profile representing weather conditions on a roadway segment of a transportation infrastructure for which pavement conditions are to be modeled;

ingesting, as a second set of input data, traffic data, and developing a traffic profile representing traffic conditions on the roadway segment for which pavement conditions are to be modeled;

ingesting, as a third set of input data, road condition data collected from one or more of road sensors, mobile sensors, and vehicle-based systems, and developing standardized road condition reports representing roadway conditions on the roadway segment for which pavement conditions are to be modeled;

assimilating, in a computing environment comprised of hardware and software components that include at least one processor configured to analyze the meteorological profiles, the traffic profiles, and the standardized road condition reports in a road condition model that simulates and iteratively adjusts pavement condition states from behavior of a pavement response to one or more of 1) changes in states of moisture resulting from heat and moisture exchanges between a pavement surface, the atmosphere, and one or more pavement substrates in a pavement's composition 2) traffic flow characteristics that include deviations from a normal traffic state at a specified period of time indicated in the traffic profile, and 3) experienced roadway conditions from the standardized road condition reports, and predicts pavement condition states over the specified period of time; and generating one or more of a plurality of output pavement conditions from the simulated and predicted pavement condition states to output data modules configured to develop spatial, trip, and time-series content in one or more related application programming interfaces, and interpretations of the simulated and predicted pavement condition states for distribution to output data modules configured to develop enhanced commercial content in one or more related application programming interfaces.

2. The method of claim 1, wherein at least one of the weather data, traffic data, and road condition data further includes data collected from crowd-sourced observations.

3. The method of claim 1, wherein the weather sensors are comprised of at least one of radar systems, surface networks, and image-based systems.

4. The method of claim 1, wherein the traffic data is representative of actual traffic conditions that include traffic speed data, traffic flow data, and incident data, from one or both of analyzed traffic characteristics that include traffic information generated by a traffic state estimation platform, and predicted traffic characteristics that include predicted traffic speed and predicted traffic volume generated by a traffic prediction platform.

5. The method of claim 1, wherein the road condition model simulates and iteratively adjusts pavement condition states from behavior of a pavement in response to experienced roadway conditions from the standardized road condition reports for a specified period of time.

6. The method of claim 1, wherein the road condition data comprises maintenance data relative to treatments provided to a roadway surface, the vehicle-based systems including systems coupled to winter maintenance vehicles.

7. The method of claim 1, further comprising associating the traffic profiles, meteorological profiles, and standardized road condition reports with representative road segment metadata maintained in at least one road segment database.

8. The method of claim 1, wherein the generating interpretations of the simulated and predicted pavement condition states for distribution to output data modules configured to develop enhanced commercial content further comprises developing at least one of output data packaged for traffic flow models to improve traffic prediction, quantitative metrics of travel difficulty along a specific roadway segment that include one or more of textual, visual and numerical summarizations of pavement condition states in an area including one or more roadway segments, and one or more of textual, visual, and numerical summarizations of pavement condition states for a user-defined trip.

9. The method of claim 1, wherein the generating one or more of a plurality of output pavement conditions from the simulated and predicted pavement condition states to output data modules further comprises developing at least one of map tiles and vectorized roadway condition data for a mapping function, developing pavement conditions for a set of locations or times in a trip, and developing pavement conditions at a fixed location over time for a time-series display.

10. The method of claim 1, wherein the generating one or more of a plurality of output pavement conditions from the simulated and predicted pavement conditions states to output data models further comprises displaying cross-sectional animations of a pavement condition on a graphical user interface.

11. The method of claim 1, wherein the generating one or more of a plurality of output pavement conditions from the simulated and predicted pavement conditions states to output data models further comprises generating a display of a pavement condition state in a broadcast media presentation tool configured to provide one or more of visual, textual, an audial content to a broadcast audience.

12. The method of claim 1, further comprising ingesting image data received from one or more video cameras configured to collect images of the roadway to be modeled, and adjusting, based on one or more visual characteristics within the image data, an existing state of the roadway in the road condition model for consistency with road, traffic and weather conditions indicated in image data.

13. The method of claim 1, wherein predictions of pavement condition states at least include forecasts of at least one of pavement surface temperatures and pavement conditions.

14. A system comprising:

a computer processor; and at least one computer-readable storage medium operably coupled to the computer processor and having program instructions stored therein, the computer processor being operable to execute the program instructions to operate a road condition model in a plurality of data processing modules, the plurality of data processing modules including:

a data ingest module configured to receive, as input data, weather data representing meteorological conditions experienced on segments of roadway a transportation infrastructure, and traffic data representing traffic conditions experienced on segments of roadway in a transportation infrastructure, and road condition data representing factors relating to experienced road conditions on segments of a transportation infrastructure;

a pavement analysis module configured to simulate and iteratively adjust pavement condition states from behavior of a pavement in response to one or more of 1) changes in states of moisture resulting from heat and moisture exchanges between the road surface, the atmosphere, and one or more pavement substrates in a pavement's composition, 2) traffic flow characteristics that include deviations from a normal traffic state at a specified period of time, and 3) experienced road conditions, and a forecast module configured to generate predictions of pavement condition states over the specified period of time.

15. The system of claim 14, further comprising at least one module configured to generate content representative of the simulations and predictions of pavement condition states, the content configured for delivery in at least one of indicia for visual display on a graphical user interface, textual information, or audio, for use by motorists, for communication to vehicles, for use by industry and public entities, and as content for distribution to one or more media outlets.

16. The system of claim 15, wherein the content further includes the simulations and predictions of pavement condition states interpreted for at least one of a traffic model application programming interface, a mobility application programming interface, an area summary application programming interface, and trip summary application programming interface.

17. The system of claim 15, wherein the content further includes one or more of animated time-series of cross-sectional profiles of the simulations and predictions of pavement conditions states for a time-series data application programming interface, tiles or vectorized profiles of pavement conditions configured for display of spatial data in an application programming interface for a mapping function, and roadway conditions for a set of locations or times in a trip in an application programming interface for display of trip data.

18. The system of claim 15, wherein the content includes cross-sectional animations of a pavement condition for display on a graphical user interface.

19. The system of claim 15, wherein the content includes a display of a pavement condition state in a broadcast media presentation tool configured to provide one or more of visual, textual, an audial content to a broadcast audience.

20. The system of claim 14, wherein data ingest module is further configured to generate meteorological profiles from the weather data, traffic profiles from the traffic data, and standardized road condition reports from the road condition data.

21. The system of claim 14, wherein the data ingest module is further configured to associate the weather data, the traffic data, and the road condition data with road segment network information.

22. The system of claim 14, wherein the ingested traffic data includes actual traffic conditions that include traffic speed data, traffic flow data, and incident data, from one or both of analyzed traffic characteristics that include traffic information generated by a traffic state estimation platform, and predicted traffic characteristics that include predicted traffic speed and predicted traffic volume generated by a traffic prediction platform.

23. A method of modeling pavement conditions in a transportation infrastructure network, comprising:
developing associations of input data to road segment metadata in a plurality of profiles in at least one processor in a computing environment comprised of hardware and software components to enable a plurality of data processing functions in a road condition model, the plurality of profiles include a meteorological profile representing weather conditions, a traffic profile representing traffic conditions, and standardized road condition reports representing experienced road conditions, for roadway segments of a transportation infrastructure;
simulating and iteratively adjusting pavement condition states from a behavior of a pavement for a roadway segment in response to one or more of 1) changes in states of moisture resulting from heat and moisture exchanges between the road surface, the atmosphere, and one or more pavement substrates in the pavement's composition as a result of impacts on the pavement by weather, traffic, and road conditions experienced on the roadway segment, 2) traffic flow characteristics that include deviations from a normal traffic state, at a specified period of time, and 3) the experienced road conditions from the standardized road condition reports; and
predicting pavement condition states over the specified period of time, wherein predictions of pavement condition states at least comprise forecasts of pavement surface temperatures and conditions.

24. The method of claim 23, wherein the input data is comprised of weather data collected from one or more of weather sensors, satellite networks, vehicle-based systems, and numerical weather prediction models, the weather data representative of one or more of atmospheric temperature, humidity, wind speed, and precipitation in an area in which the roadway segments are located.

25. The method of claim 23, wherein the input data is comprised of traffic data representative of actual conditions in one or both of analyzed traffic characteristics and predicted traffic characteristics experienced on the roadway segments, wherein the actual traffic conditions include traffic speed data, traffic flow data, and incident data.

26. The method of claim 25, wherein the analyzed traffic characteristics include traffic information generated by a traffic state estimation platform, and wherein the predicted traffic characteristics include predicted traffic speed and predicted traffic volume generated by a traffic prediction platform.

27. The method of claim 23, wherein the input data is comprised of road condition data collected from one or more of road sensors, mobile sensors, and vehicle-based systems, the road condition data representative of roadway conditions experienced on the roadway segments.

28. The method of claim 23, further comprising generating cross-sectional animations of a pavement condition state on a graphical user interface.

29. The method of claim 23, further comprising generating a display of a pavement condition state in a broadcast media presentation tool configured to provide one or more of visual, textual, an audial content to a broadcast audience.

30. The method of claim 23, further comprising generating output data packaged for traffic flow models to improve traffic prediction, quantitative metrics of travel difficulty along a specific roadway segment that include one or more of textual, visual and numerical summarizations of pavement condition states in an area including one or more roadway segments, one or more of textual, visual, and numerical summarizations of pavement condition states for a user-defined trip, and at least one of map tiles and vectorized roadway condition data for a map of one or more roadway segments.

* * * * *